(12) United States Patent
Cram

(10) Patent No.: US 7,274,197 B2
(45) Date of Patent: **\*Sep. 25, 2007**

(54) CONTACT SYSTEM FOR INTERFACING A SEMICONDUCTOR WAFER TO AN ELECTRICAL TESTER

(75) Inventor: Daniel P. Cram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/609,663

(22) Filed: Dec. 12, 2006

(65) Prior Publication Data

US 2007/0080698 A1 Apr. 12, 2007

Related U.S. Application Data

(63) Continuation of application No. 10/819,673, filed on Apr. 7, 2004, now Pat. No. 7,176,702.

(51) Int. Cl.
*G01R 31/02* (2006.01)
(52) U.S. Cl. .................................. 324/754; 324/158.1
(58) Field of Classification Search ........ 324/754–762, 324/158.1, 73.1; 439/66–72, 482
See application file for complete search history.

(56) References Cited

U.S. PATENT DOCUMENTS 4,423,376 A 12/1983 Byrnes et al. .............. 324/158
4,506,215 A 3/1985 Coughlin et al. ........... 324/158
4,622,514 A 11/1986 Lewis ........................ 324/761
5,225,777 A * 7/1993 Bross et al. ................ 324/754
5,367,254 A * 11/1994 Faure et al. ................ 324/761
6,404,211 B2 6/2002 Hamel et al. ............... 324/754
7,176,702 B2 * 2/2007 Cram ......................... 324/754

* cited by examiner

*Primary Examiner*—Vinh P. Nguyen
(74) *Attorney, Agent, or Firm*—Wong, Cabello, Lutsch, Rutherford & Brucculeri, LLP

(57) ABSTRACT

Disclosed herein are exemplary embodiments of a contact system (referred to as a "Z-block") for interfacing a semiconductor wafer to an electrical tester, and methods for making the same. In a preferred embodiment, the Z-block comprises three stacked pieces or layers: an upper and lower piece which are similar in structure, and a unique middle piece. The pieces each contain corresponding locking holes and probe pin holes. The locking holes are strategically arranged on each of the pieces to allow the stacked piece structure to be locked together at various points during its manufacture. After alignment of the probe pin holes in the various pieces, probe pins are injected into these holes. The probe pins are then aligned and locked into place by moving the middle piece relative to the upper and lower pieces. Such locking of the probe pins is accomplished through interaction of the middle piece with the shape of the probe pins, which prevents the probe pins from slipping out of the probe pin holes.

34 Claims, 18 Drawing Sheets

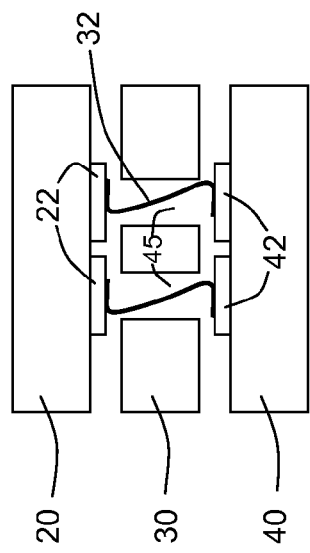
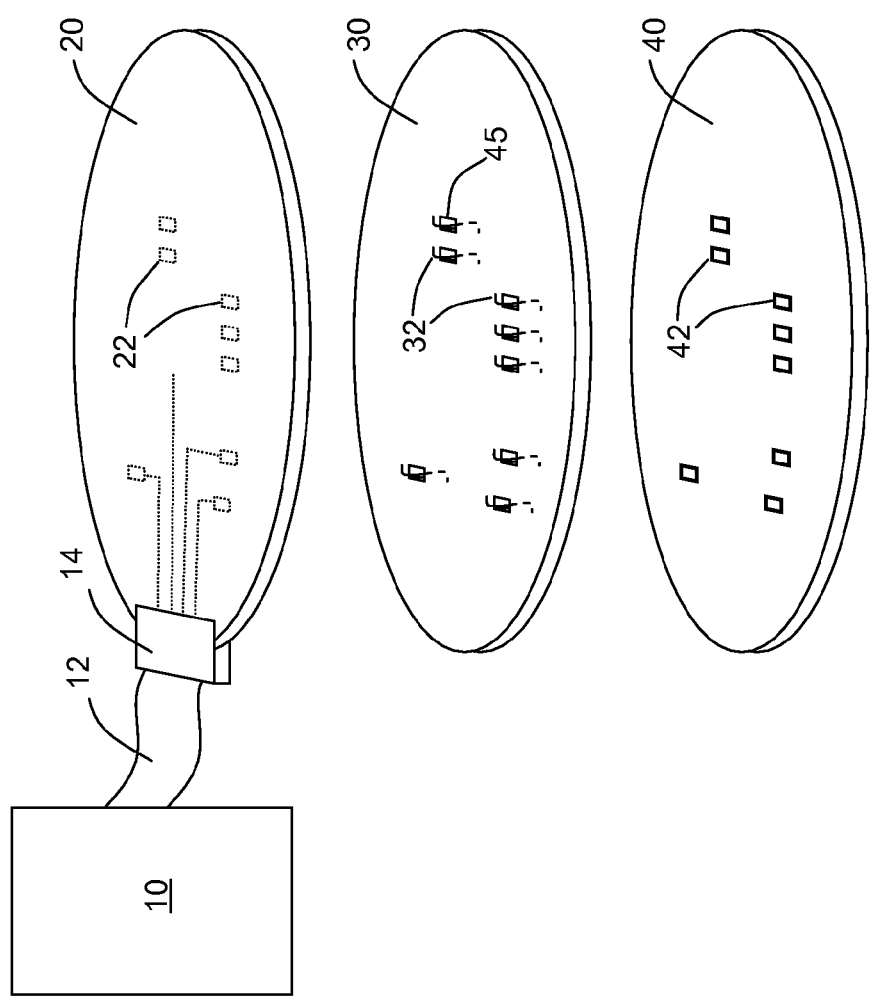
*Figure 1B (prior art)*
*Figure 1A (prior art)*

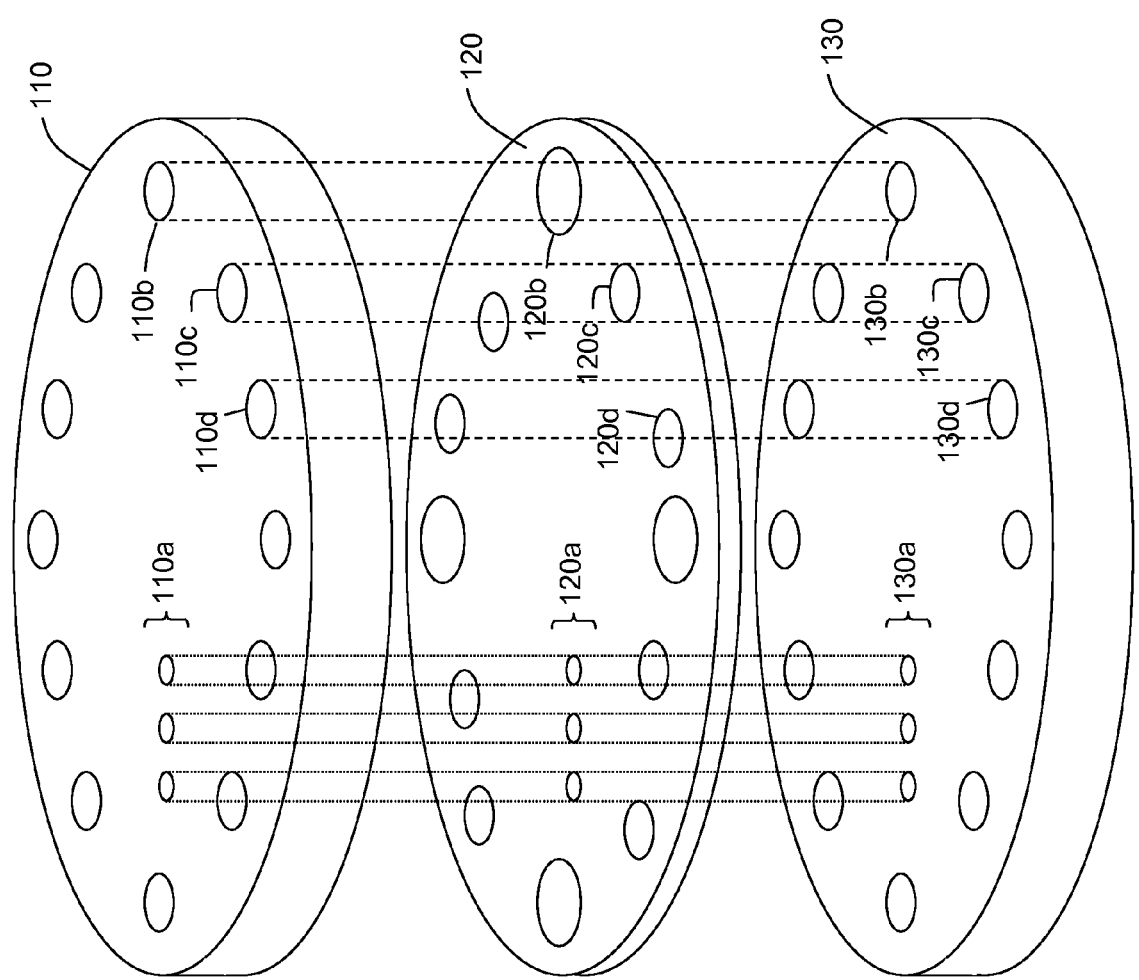

CONTACT SYSTEM FOR INTERFACING A SEMICONDUCTOR WAFER TO AN ELECTRICAL TESTER

CROSS-REFERENCE TO RELATED APPLICATIONS

This is a continuation application of U.S. application Ser. No. 10/819,673, filed Apr. 7, 2004, now U.S. Pat No. 7,176,702, which is incorporated herein by reference in its entirety and to which priority is claimed.

FIELD OF THE INVENTION

This invention relates a contact system for testing semiconductor devices, and preferably to a contact system for interfacing a semiconductor wafer to an electrical tester.

BACKGROUND

As is known, semiconductor integrated circuit devices ("chips") can be tested while they are still present on the semiconductor wafer on which they were formed. Such wafer level testing is traditionally accomplished on a per chip basis, in which probe tips are brought into contact with bond pads for a given chip, the chip is stimulated and tested through the probe tips via a tester, and then the wafer is indexed and moved to the next chip which is similarly tested, etc.

However, systems also exist which are capable of testing an entire semiconductor wafer, i.e., all chips on the wafer simultaneously and without the need to index from chip to chip. While such systems can be used to test the chips on the wafer for basic functionality, they are also particularly useful to stress the chips for a limited period of time for the purpose of weeding out early latent failures, what is known in the art as "burn in." When burning in a wafer, and as shown in FIG. 1A, signals are sent from a tester 10 through a cable conduit 12 and edge connector 14 to a burn in board or "fan out" board 20. As one skilled in the art will appreciate, the burn in board 20, which typically constitutes a Printed Circuit Board (PCB), contains contact points 22 on its underside (shown in phantom) which match the locations of the bond pads 42 on the wafer 40 being tested or burned in. (Only several corresponding contact point 22/bond pad 42 pairs are shown in FIG. 1A for simplicity, although one skilled in the art will recognize that tens of thousands or more can be present). Such bond pads 42 may constitute redistribution bond pads routed to convenient locations and at a more relaxed pitch that is easier to probe than are traditional bond pads.

To electrically and physically mate the contact points 22 with the bond pads 42, an intermediary structure is interposed therebetween. This intermediary structure is sometimes known as a "Z-block," which is so named because it mates the contact point 22/bond pad 42 pairs along the Z (or vertical) axis. The Z-block 30 contains holes 45 therethrough which similarly match the location of each contact point 22/bond pad 42 pair. Interposed in each hole is a conductive probe pin 32. When the burn in board 20, the Z-block 30, and the wafer 40 are sandwiched together during a testing or burn-in operation, and as shown in cross-section in FIG. 1B, the ends of the probe pins 32 will contact the contact points 22 on one side of the Z-block 30 and the bond pads 42 on the wafer 40 on the other side. Because of the mechanical nature of the coupling of this stack, it is preferred that the probe pins 32 be deformable in a spring like manner. Many shapes are possible for the probe pins 32, which may comprise helical spring, leaf springs, "pogo pins," springs made from flat sheets of metal, etc.; the S-shaped probe pin shown in the Figures is merely exemplary, and other probe pin designs will be discussed in this disclosure.

It can be difficult to construct a Z-block 30, as a number of parameters constrain its design. For example, the Z-block must capture the probe pins 32 so that the pins will not fall through the Z-block. This usually requires the use of a probe pin 32 having two effective diameters: an end diameter D1 and a body diameter D2, as shown in FIG. 2A. In this example, the probe pin 32 is essentially a helical spring with straight ends used to contact the contact points 22/bond pads 42, although other pin shapes are possible. To accommodate and capture such a probe pin 32, the Z-block 30 must in turn also contain through holes 45 with two different diameters: one diameter D3 sufficiently large for the effective diameter of the probe pin end (D1) to fit through, but smaller than the effective diameter of the probe pin body diameter (D2); and a second diameter D4 sufficiently large to accompany the probe pin body diameter (D2).

This relationship can be accomplished in different ways. For example, and as shown in FIG. 2A, the Z-block 30 can be formed of two separate pieces 50a and b. Each piece has holes 45 drilled therein corresponding to the eventual location of the probe pins 32. Through the use of an angled drill bit, holes 45 having a conical ends can be formed which meet the two-diameter requirement noted above for retaining the pins 32. Such holes 45 must be drilled precisely along the Z-axis lest the diameters of the holes (e.g., D3) become skewed or non-uniform, which can be very difficult or expensive to accomplish. Ultimately, the probe pins 32 are placed within the holes 45 in the lower of the two pieces 50a, and thereafter the upper piece 50b is affixed (e.g., bolted, glued, etc.) to the lower piece 50a to capture the probe pins 32, as shown in FIG. 2B. FIGS. 2C and 2D disclose other Z-block geometries for capturing the probe pins 32 which again use multiple affixable pieces, although in these examples the pieces are drilled with perfectly cylindrical holes 45.

Regardless of the scheme used to form the Z-block 32, ultimately all of the schemes involve the same step of (1) placing the pins 32 into holes 45 in at least one lower piece of the Z-block, and (2) placing at least one other piece of the Z-block over the pins to capture them and affixing the pieces together. But this is difficult to do in practice. The probe pins 32 are very delicate, being on the order of 100 mils in length and made of wire which may have a thickness of approximately 3 mils for a 100 mil length coil spring pin. It is therefore difficult to insert the probe pins 32 into the lower piece 50b such that their ends protrude through the smaller diameter holes (D3). Moreover, if the probe pins 32 lay askew in their holes 45 when the upper piece 50b is placed on top of the lower piece 50a, the ends of the pins 32 may not pass through the holes 45 in the upper piece, and instead will become bent within the holes and unable to make contact with the points/pads 22 or 42. This problem is exacerbated when it is recognized that a typical Z-block 30 may contain tens of thousands of probe pins 32, thus requiring the ends of the pins to simultaneously pass through the upper piece 50b when it is mounted to the lower piece 50a, a formidable challenge. Damage to any one of these pins 32 may require opening and re-working the Z-block 30 to replace affected or damages pins, which requires unaffixing (e.g., unbolting) the upper and lower pieces 50a and 50b. This reopening procedure too can cause problems, as this operation can tend to drag the otherwise properly-aligned pins 32 out of their holes 45, which can occur if the delicate pins bind to the smaller diameter portions (D3) of the holes. This can be a problem even if no pins 32 are damaged through assembly of the Z-block, but instead become worn though use and need replacement.

Moreover, capturing the spring limits the sorts of probe pins that can be used with known prior art Z-block approaches. As noted above, the probe pins 32, be they springs, pogo pins, etc., necessarily must contain end portions with smaller effective diameters (D1) than the main body portion of the pins (D2) so that they can be captured, but still protrude from, the holes 45 (D3, D4). Such a limitation to the design of the probe tips is unfortunate. For example, consider the probe pin 32 of FIG. 3, which has a flat, long end 32a. This end design for the pin may be used, for example, as the portion of the pin 32 to make contact with the bond pads 42, which is beneficial as a flat end 32a is less likely to stab and damage the bond pads 42. However, such a pin design cannot be used with prior art means for capturing the springs as shown in FIGS. 2A-2D, because the effective diameter of end 32a (D5) is greater than the effective diameter of the body of the spring (D6).

Another problem that prior art Z-block designs do not adequately address is the issue of probe pin orientation within the holes of the Z-block. As shown by the probe pin design of FIG. 3, not all probe pins are rotatably symmetrical about their long axis 60. But probe pins 32, when placed in the holes 45 in prior art Z-blocks, will be able to rotate freely within the holes 45. This is undesirable, especially for asymmetric probe pins. For example, as shown in FIG. 4, if the probe pin of FIG. 3 was mounted within a prior art Z-block, it would be allowed to turn such that the various ends 32a of the probe pins 32 would become misaligned (in solid lines). Such non-uniformity is undesirable as it may make contact of such ends to bond pads 42/contact points 22 unreliable or could result in shorting and limiting probe design. It would therefore be preferable for the probe pins 32 to be non-movably aligned in the holes, which would, for example, allow the ends 32a to have a uniform orientation (in dashed lines).

In short, there is room to improve to Z-block designs. Such improvement would preferably make assembly of the Z-block easier, installing and servicing of the probe pins easier, would accommodate a wide variety of probe pin designs, and would be cheaper to manufacture. This disclosure presents such solutions.

SUMMARY OF THE INVENTION

Disclosed herein are exemplary embodiments of a contact system (referred to as a "Z-block") for interfacing a semiconductor wafer to an electrical tester, and methods for making the same. In a preferred embodiment, the Z-block comprises three stacked pieces or layers: an upper and lower piece which are similar in structure, and a unique middle piece. The pieces each contain corresponding locking holes and probe pin holes. The locking holes are strategically arranged on each of the pieces to allow the stacked piece structure to be locked together at various points during its manufacture. After alignment of the probe pin holes in the various pieces, probe pins are injected into these holes. The probe pins are then aligned and locked into place by moving the middle piece relative to the upper and lower pieces. Such locking of the probe pins is accomplished through interaction of the middle piece with the shape of the probe pins, which prevents the probe pins from slipping out of the probe pin holes.

BRIEF DESCRIPTION OF THE DRAWINGS

Embodiments of the inventive aspects of this disclosure will be best understood with reference to the following detailed description, when read in conjunction with the accompanying drawings, in which:

FIGS. 1A and 1B show the basic components of a prior art system for testing or burning in a wafer using an intermediary Z-block between the burn in board and the wafer.

FIGS. 5A-5B show the various locking holes (b, c, d) and probe pins holes (a) in the upper, middle, and lower portions of an embodiment of the disclosed Z-block, and the relative orientation of those holes.

DETAILED DESCRIPTION

Disclosed herein is an improved Z-block design, and methods for its manufacture. The disclosed design is simple to manufacture, easy to install the probe pins into, easy to service, and can accommodate a number of probe pin designs. Moreover, the design allows for rotation of the probe pins within the Z-block so that they can be aligned, and locking of those aligned pins into place.

Figure 5A:
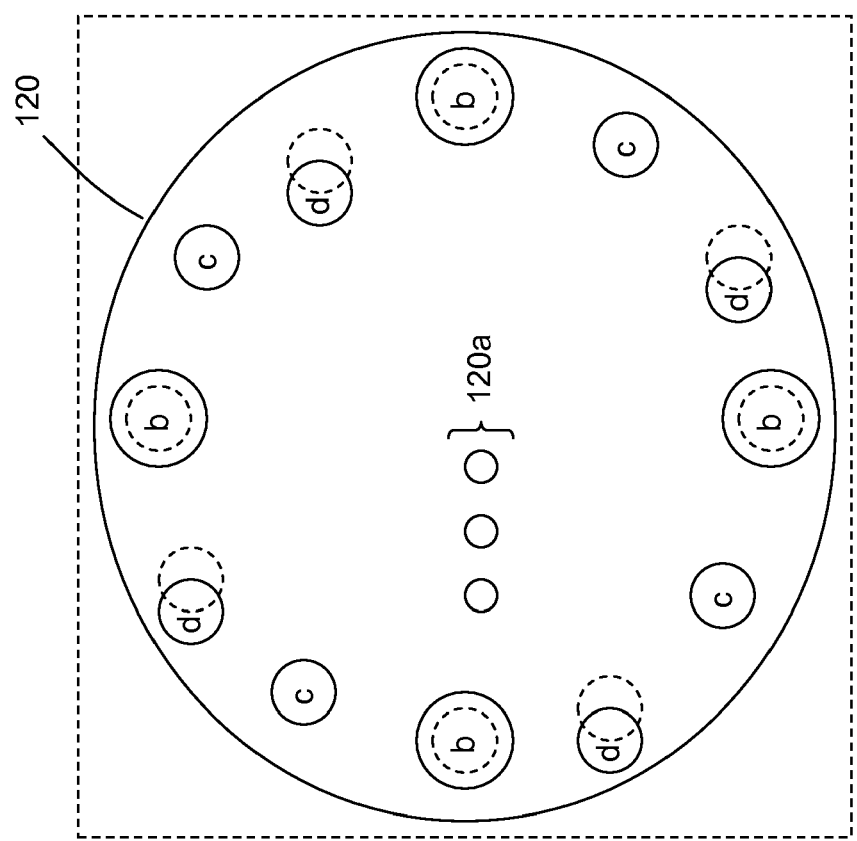
Figure 5A:
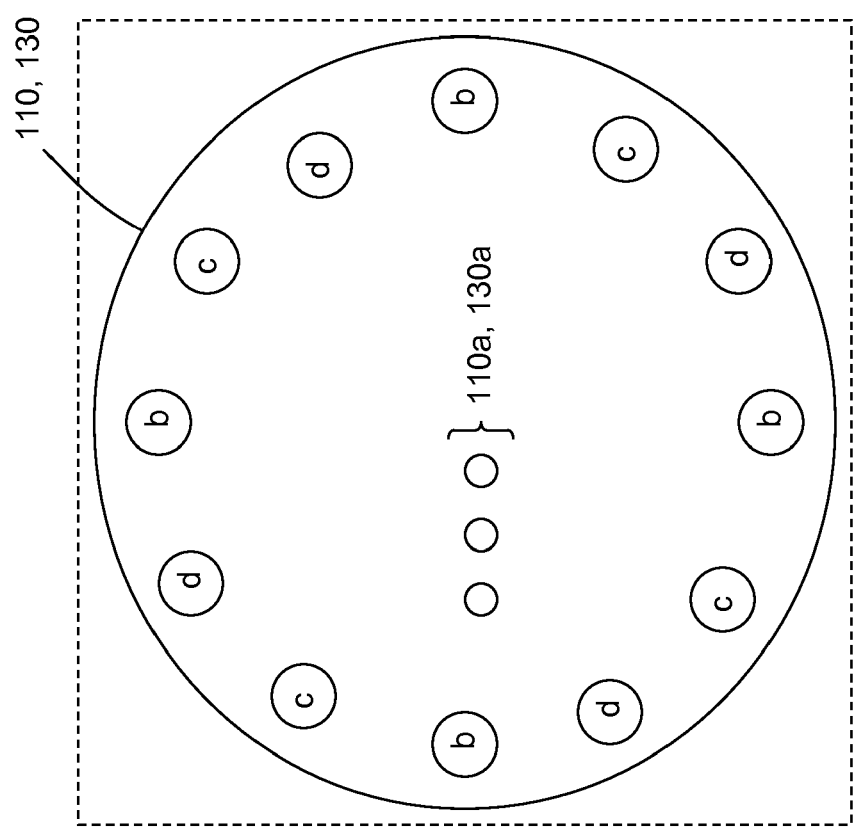

FIGS. 5A and 5B illustrate a simple illustrative embodiment of the Z-block 100's design, and illustrate the various pieces of the Z-block in a plan view and perspective view respectively. In this embodiment, the Z-block 100 comprises three different pieces (e.g., plates): an upper piece 110, a middle piece 120, and a lower piece 130. When the Z-block is assembled, each of these pieces is stacked and locked together to capture the probe pins 150, as will be seen in subsequent drawings.

Each of the pieces 110, 120, 130 contains a number of holes (a, b, c, d) which perform various functions in the Z-block. Holes 110a, 120a, 130a are the holes that ultimately will contain the probe pins 150; only a few representative holes are shown in FIGS. 5A and 5B for clarity, but tens of thousand can be present. The b, c, and d holes allow the pieces of the Z-block 100 to be locked together at various points during the Z-block's assembly, or upon final assembly of the Z-block. Specifically, holes 110b, 120b, 130b allow the Z-block to be locked prior to probe pin insertion; holes 110c, 120c, 130c allow the Z-block to be locked during pin insertion; and holes 110d, 120d, 130d, allow the Z-block to be locked after probe pin insertion and capture, which completes assembly of the Z-block. These various locking procedures will be described in further detail in conjunction with FIGS. 6-15.

Although the locking holes (b, c, d) are preferably disposed around the periphery of the pieces 110, 120, 130 and away from the working area of the pieces where the probe pins are located, this is not strictly necessary. Moreover, although only four of each of these locking holes are shown, more or less may be present (three, six, etc.).

Figure 17:
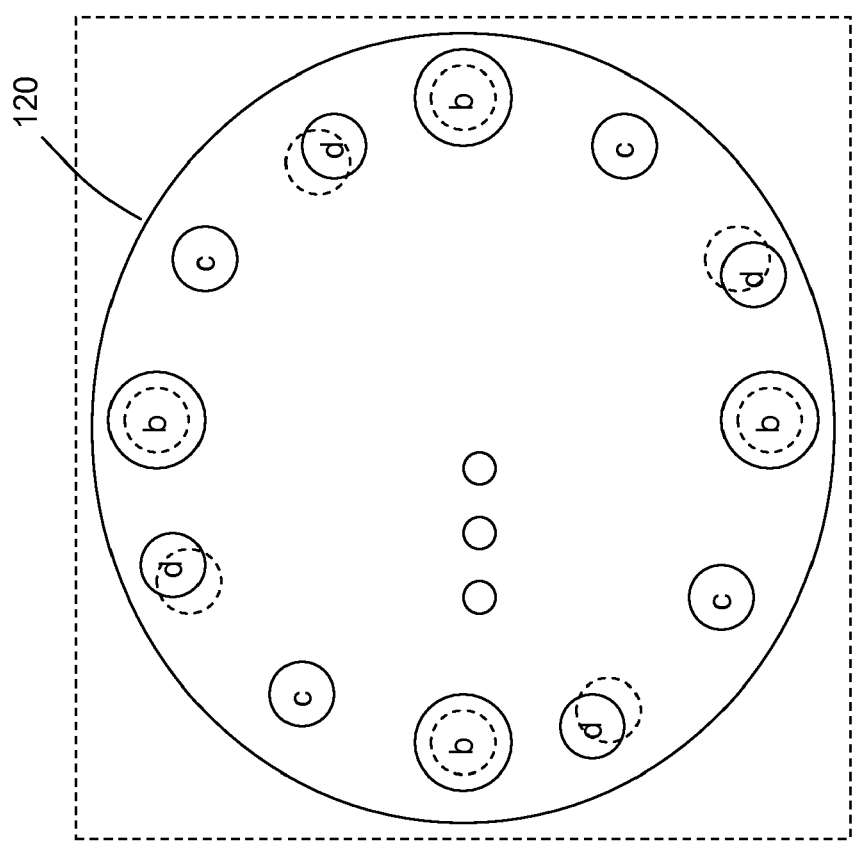
FIG. 17 shows an alternative probe pin locking scheme.
Figure 17:
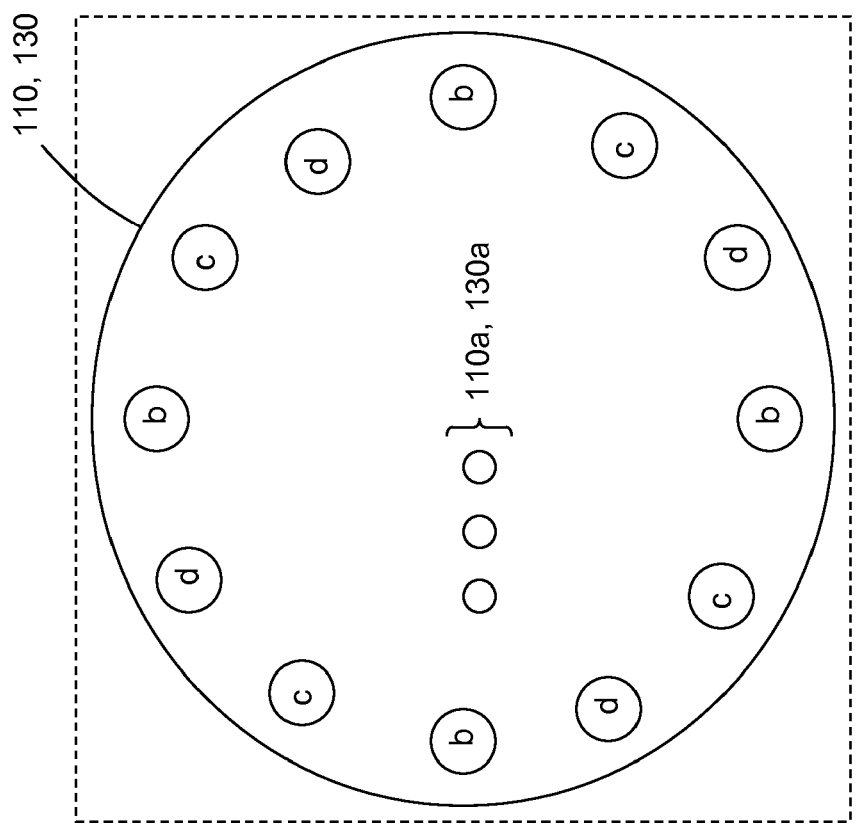

The various holes (a, b, c, d) are preferably the same in the upper and lower pieces 110 and 130, and in this regard the same piece can be used for both. Holes 110a, 130a, which ultimately hold the springs, have a diameter of approximately 15 mils, while holes 110b-d, 130b-d have a larger diameter of roughly 1 mm. Of course, other diameters can be used. The middle piece 120, however, is different; its probe pin holes 120a are the same as that of the upper and lower pieces 110, 130, as are its locking holes 120c. However, locking holes 120b are larger in diameter than corresponding holes 110b, 130b, measuring approximately 2 mm in diameter. Furthermore, locking holes 120d are linearly shifted with respect to corresponding holes 110d, 130d, although they are equal in size (again, approximately 1 mm). (They may also be shifted is other ways, such an angularly along a common radius as shown in FIG. 17). These differences in the location and sizes of the various holes between the middle piece 120 and the upper/lower pieces 110, 130 are illustrated in FIG. 5A, in which corresponding holes for the upper/lower pieces are shown in dotted lines on the top view of the middle piece 120. Of course, the sizes of the holes are greatly exaggerated to illustrate their differences and functions more clearly.

The pieces 110, 120, and 130 of the Z-block 100 are preferably formed from Printed Circuit Board (PCB) materials, such as Arlon 55 NT or FR4, although other materials can be used as well. It is preferred to use insulating materials for the pieces (or materials that have been coated or treated to make then insulating) so that the probe pins 150 in the Z-block 100 will not short to each other. As the Z-block 100 may be used in high-temperature applications, such as during burn in, it is also preferred that materials with relatively low Coefficients of Thermal Expansion (CTEs) be used which have a similar CTE to the wafer being tested. If necessary, non-functional holes can be drilled in the pieces to reduce their bulk to effectively lower their CTEs and allow for constrainment. The pieces 110, 120, and 130 can also be coated to reduce sliding friction and to prevent them from bonding or sticking together. (As will be seen herein, the ability to slide the pieces with respect to one other is an important aspect of some embodiments of the invention). Teflon or Parylene works well for such coatings.

As will be seen later, the thicknesses for the pieces 110, 120, 130 can vary depending on the probe pin design that is to be used with the Z-block 100. However, in a preferred embodiment, the upper and lower pieces 110, 130 are approximately 60-70 mils thick, while the middle piece 120 is approximately 15-20 mils thick. While it is illustrated that the pieces 110, 120, 130 forming the Z-block 100 are circular (to match the wafer 40 with which it interfaces), the pieces may take on other shapes, such as a rectangular or square shapes, as shown in dotted lines.

Figure 6:
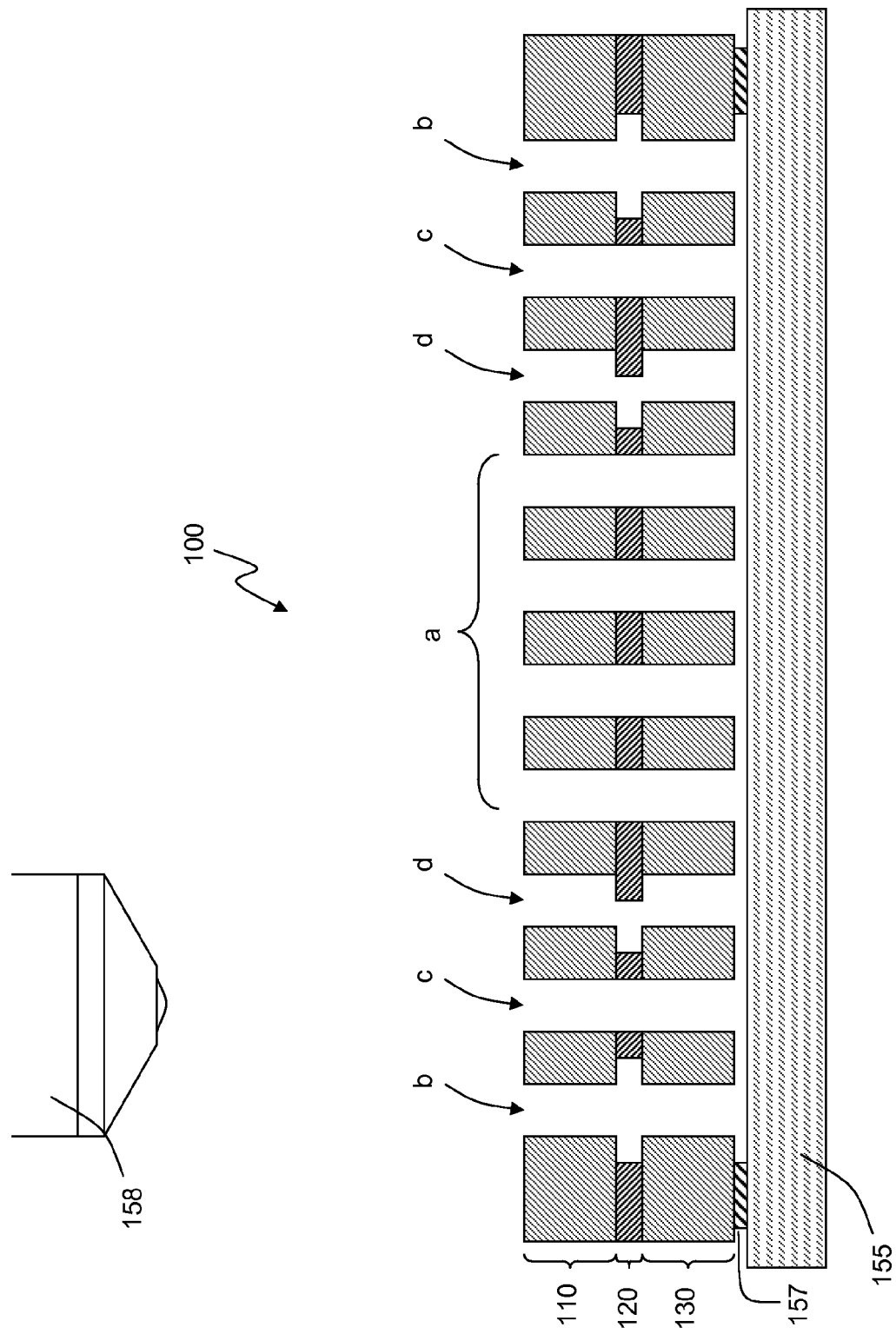
FIGS. 6-15 show sequential steps in assembling a Z-block using the pieces of FIGS. 5A-5B, including initial locking of the stack, alignment of probe pin holes and temporary locking of the same, insertion of the probe pins, alignment of the probe pins, and locking of the probe pins in their holes.

Referring now to FIG. 6, a cross-sectional view of the beginning of the assembly of the Z-block 100 is illustrated. In this illustration, each of the locking holes (b, c, d) are shown so that their various functions can be better understood. However, as FIGS. 5A and 5B reveal, such holes need not necessarily occur along a given cross section. Also, for convenience, the diameter of the probe pin holes ("a") are shown as being of the same diameter as some of the locking holes, although in reality they would be different, and typically smaller.

FIG. 6 shows the three pieces 110, 120, 130 mounted on an assembly plate 155 and spaced therefrom by spacers 157. The spacers 157 are approximately 15 mils thick and as will be made clear later provide for clearance of the ends of the probe pins once they are inserted into the pieces. The assembly plate 155 is preferably formed of a smooth material which will not bind to the probe pins, such as Pyrex, but can comprise any number of materials. The entire assembly is preferably mounted under a low-resolution optical microscope to 158 allow an operators to more easily perform the various assembly steps discussed herein.

Figure 7:
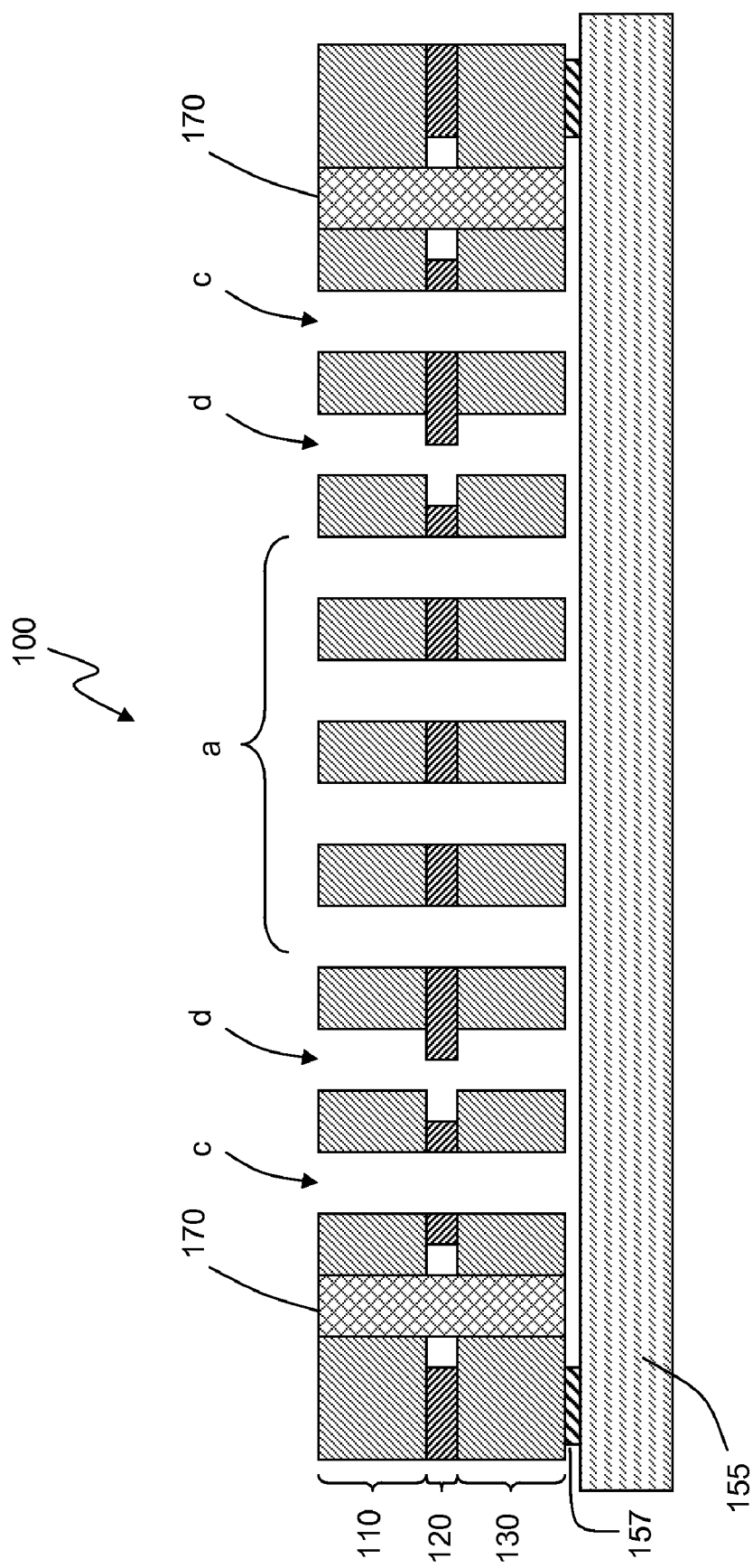

As initially shown in FIG. 6, the three pieces 110, 120, 130 are roughly aligned with one another to form a stack. However, to prepare for eventual insertion of the probe pins, the stack is preferably stabilized using locking pins or dowels 170, as shown in FIG. 7. The dowels 170 are preferably stainless steel and 1 mm in diameter, and are placed in the "b" locking holes in the various pieces. Holes 110b, 130b are slightly undersized (approximately 0.97 mm) to allow for a snug fit when the dowels 170 are pressed into the "b" holes by an operator, which can occur by hand or by using a tool (e.g., tweezers). Once the dowels 170 are in place, the stack is basically mechanically stable. Dowels 170 are preferably of approximately the same thickness as the stacked pieces, but can also protrude from the top or bottom of the stack so long as they will not affect performance of the Z-block 100 in operation. Dowels 170 could also extend from both sides for the purpose of keying to PCB test structures and/or assembly structures, etc.

Figure 8:
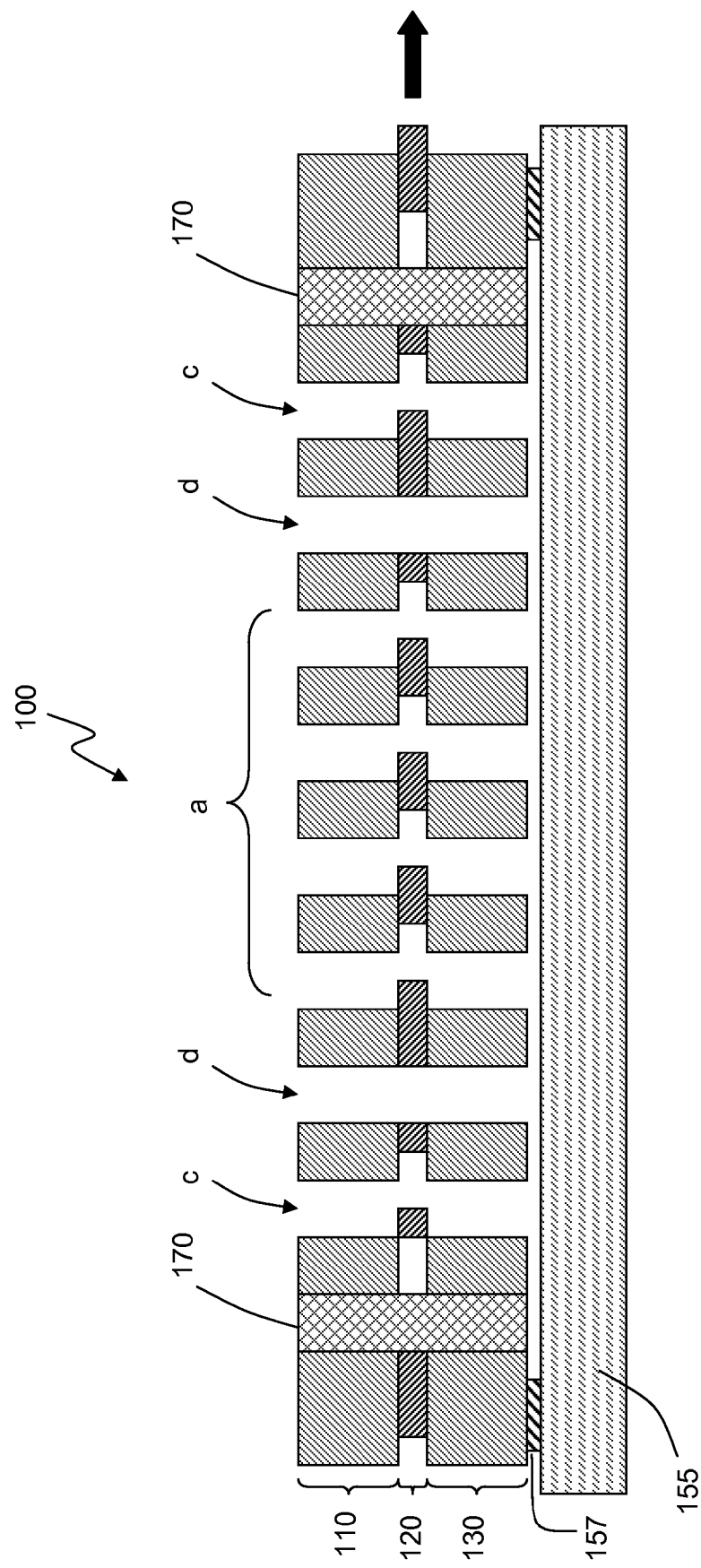

At this point, the upper 110 and lower 130 pieces of the Z-block are rigidly affixed to one another, but the middle piece 120 is slidable between the two by virtue of its larger hole 120b. As this hole is preferably 2 mm in diameter, the middle piece 120 can be shifted approximately +/-0.5 mm with respect to the dowel 170 in the X or Y (i.e., horizontal) direction. For example, as shown in FIG. 8, the middle piece 120 has been shifted approximately 0.5 mm to the right. Because middle piece 120 is moveable, an operator can push or pull the middle piece 120 to align the probe pin holes 110a, 120a, 130a to allow for smooth insertion of the probe pins 150. This is facilitated by making the middle piece 120 slightly larger in size (e.g., diameter) than the upper/lower pieces 110, 130 so that the edges of the piece 120 can be grasped by the operator. (This size difference is not shown in the Figures for clarity). To align the middle piece 120, the operator looks through the microscope 158 at a certain sample of probe pins holes ("a") across the working surface to ensure that perfect, non-eclipsed circles can be seen within the holes. A light mounted on the underside of the Pyrex assembly plate 155 (not shown) can facilitate this procedure. Optionally, alignment of the middle piece 120 can be automated, using a motorized X-Y stage and optical alignment routines similar to those traditionally used for wafer probing. Alignment can also be accomplished, or can be more easily implemented, by pushing dowels with tapered tips into the probe pin holes ("a"), or into other locking holes (not shown) having a diameter just under those of the probe pin holes ("a").

Figure 9:
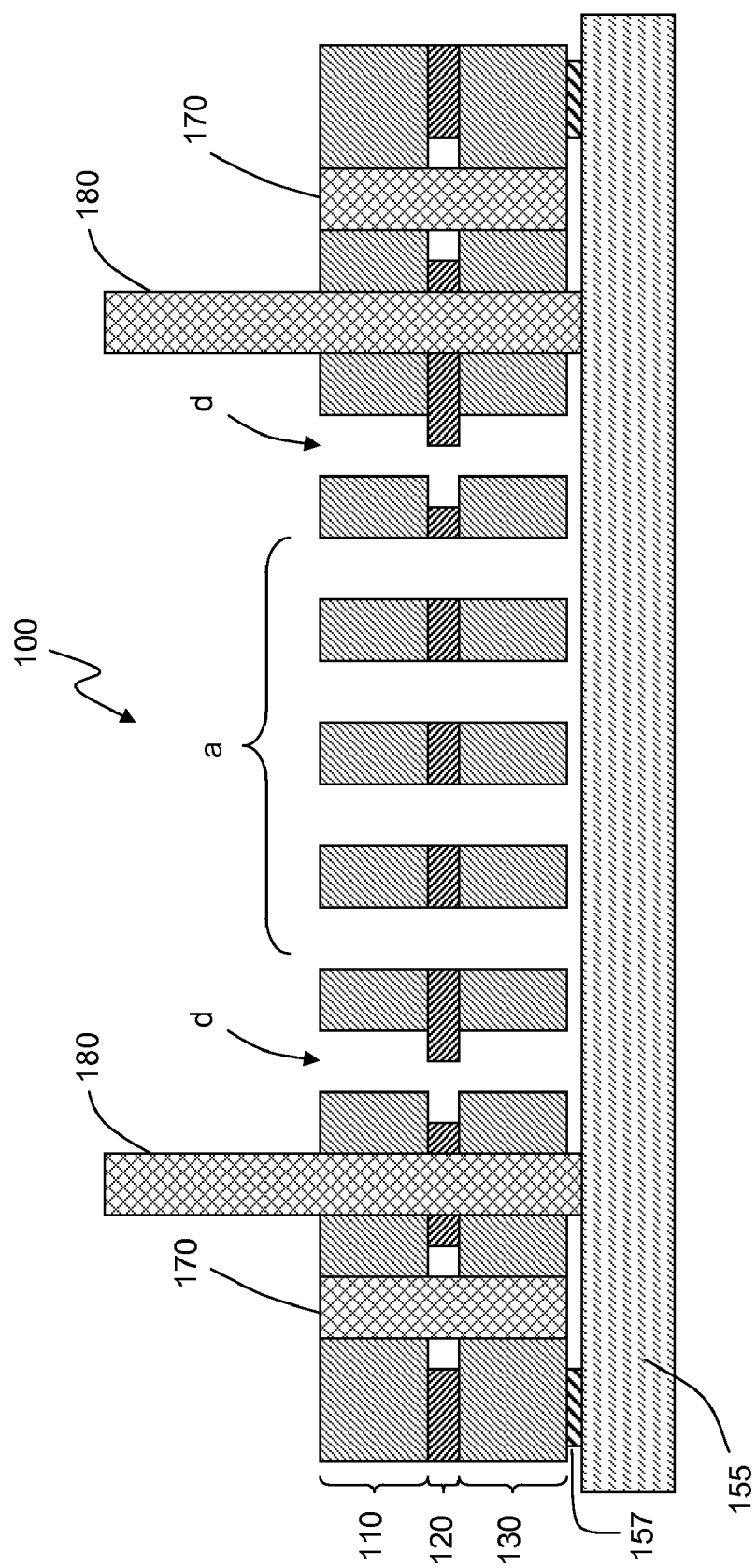

Once the middle piece 120 has been aligned, the stack is mechanically fixed to lock the middle piece 120 into place so that it can longer be horizontally shifted. This is accomplished by placing a second set of dowels 180 into the "c" holes within the pieces 110, 120, 130, as shown in FIG. 9. Dowel 180 is again preferably stainless steel and 1 mm in diameter. However, dowels 180 are substantially longer than dowels 170 and protrude from the top of the stack (perhaps 0.25 to 0.5-inch), which facilitates their eventual removal. In this regard, note that the "c" holes are all uniform in diameter and are drilled such that their alignment correspond to alignment of the probe pin holes ("a"). Thus, once the probe pin holes "a" have been manually aligned, the "c" holes are aligned also. The "c" holes are preferably slightly larger (e.g., 1.03 mm) than the dowel 180 to allow it to be easily inserted and retrieved. As a result, dowel 180 can come to rest on the surface of the assembly plate 155.

Figure 2A:
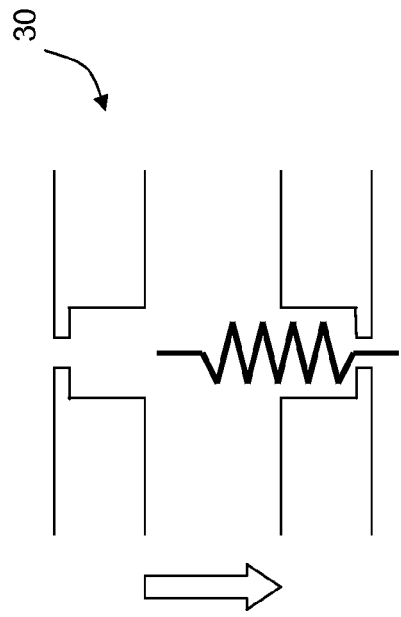
FIGS. 2A-2D shows prior art Z-block approaches in cross section, and shows capture of the probe pins within pieces of the Z-block.
Figure 2B:
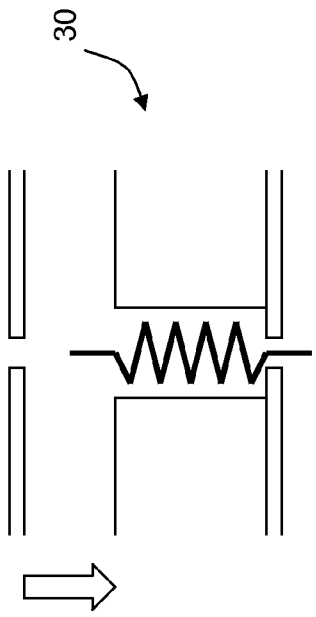
Figure 2C:
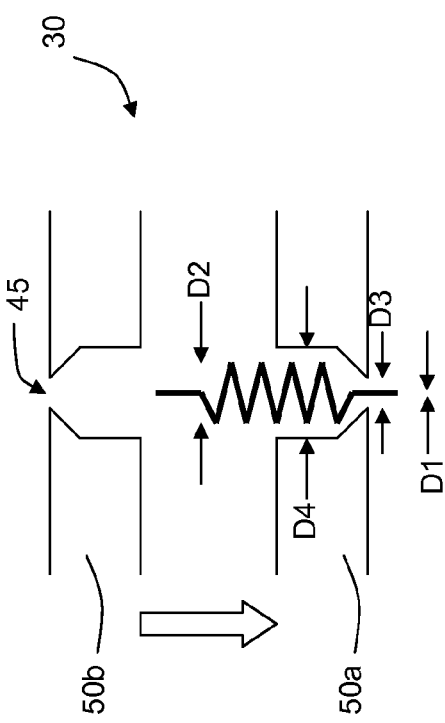
Figure 2D:
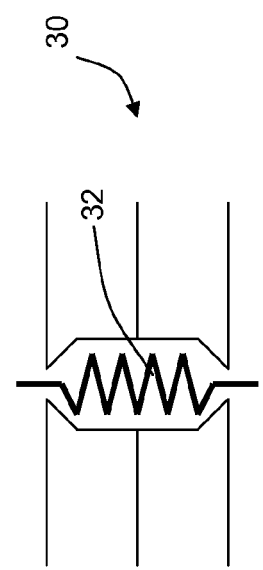
Figure 4:
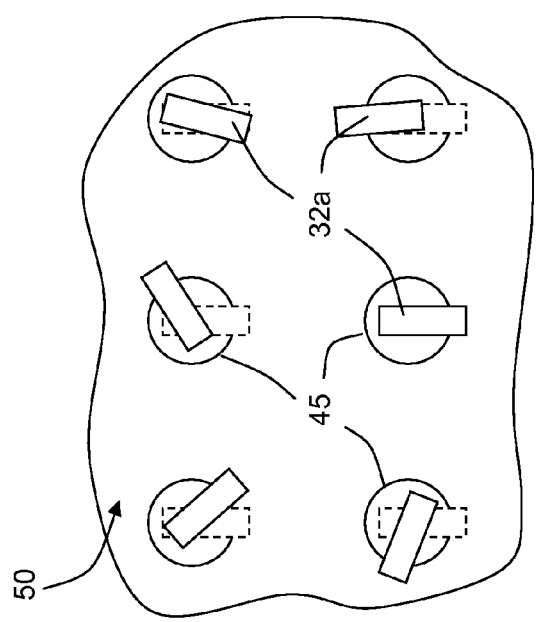
FIG. 4 shows rotational misalignment of the probe pins of FIG. 3.
Figure 3:
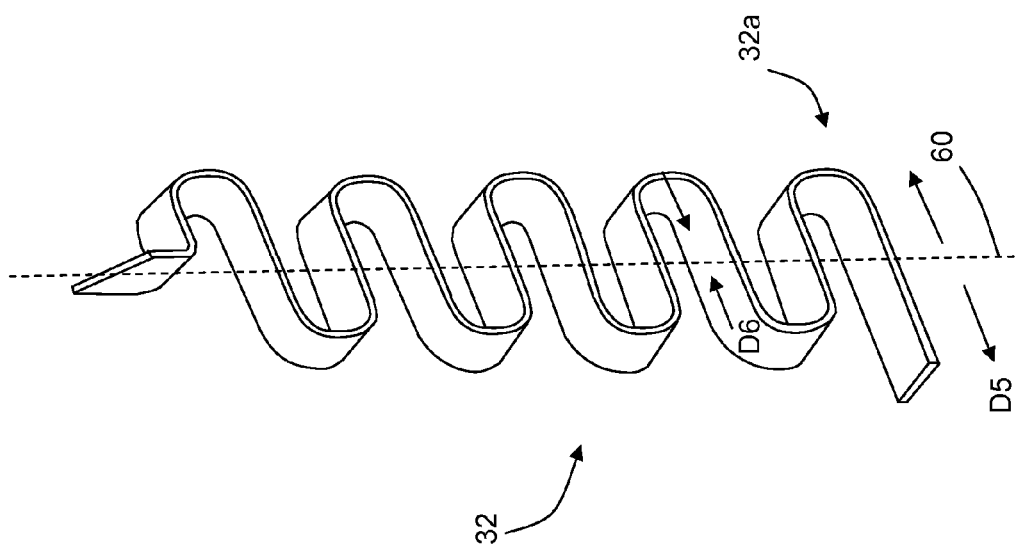
FIG. 3 shows a spring design which can be used with the disclosed Z-block design, but which is not suitable for use with the Z-block designs of FIGS. 2A-2D.
Figure 10:
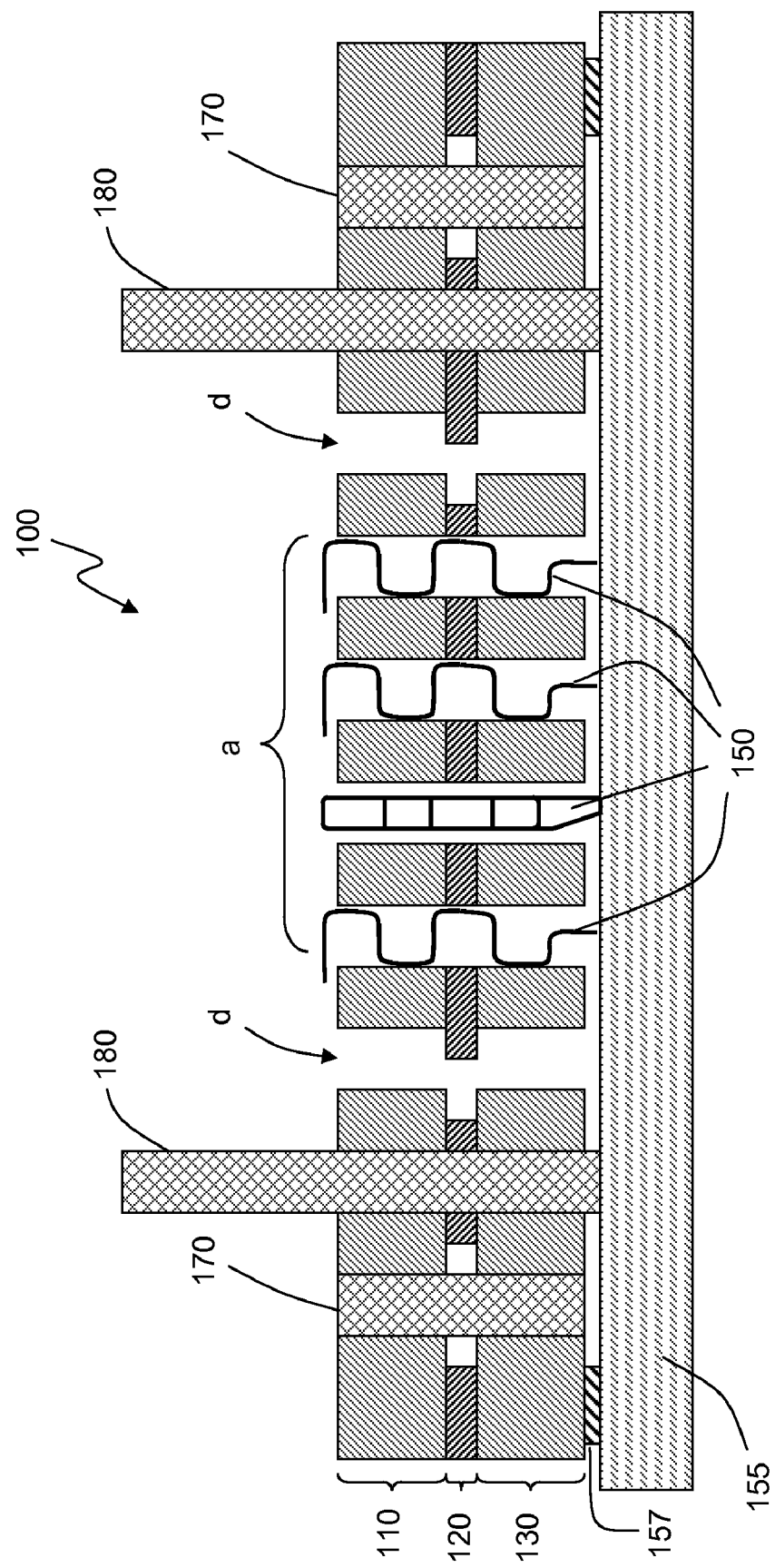
Figure 11:
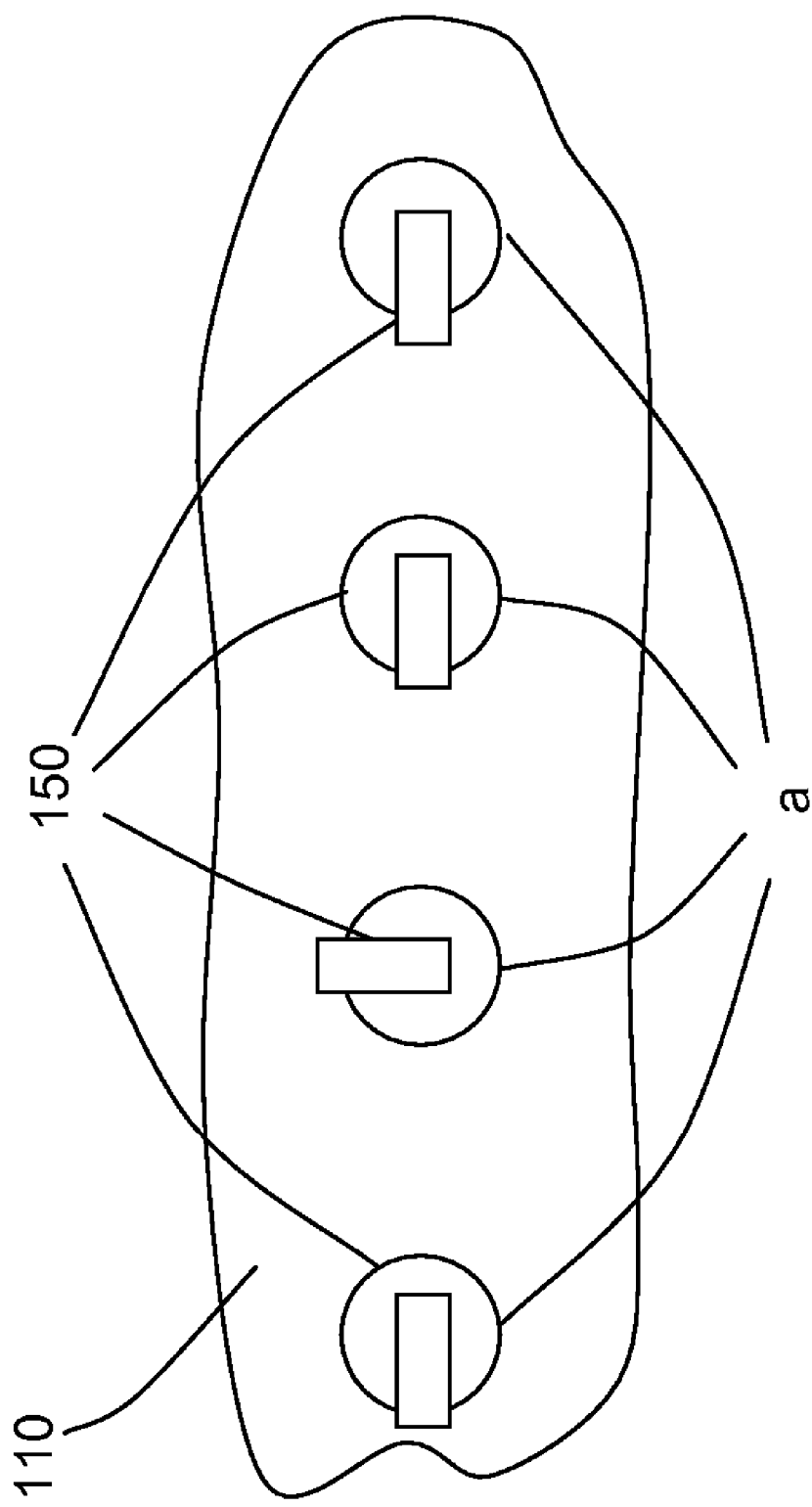

Once alignment of the middle piece 120 has been accomplished and has been locked into place using dowels 180, the probe pins 150 can be inserted into the probe pin holes ("a") as shown in FIG. 10. The probe pins 150 can be inserted in any number of ways, such as by hand, through the use of a pneumatic "gun" to "shoot" the pins into the holes, etc. In the example shown, the probe pins 150 of FIG. 3 are used, but of course many other type of probe pins designs (helical, leaf springs, etc.) can be used.

Two points are worthy of note at this stage. First, because the probe pin holes ("a") have been aligned, the probe pins 150 are easily inserted into the Z-block 100. This is much easier when compared to the prior art approaches discussed above in which the pins are first placed into non-uniform diameter holes and later sandwiched between two pieces of the Z-block. As a result of the disclosed approach, the probe pins 150 are much less susceptible to damage or binding during Z-block assembly. Second, notice that one of the probe pins 150 (second from the left) is rotationally misaligned with respect to the other pins. Specifically, this pin is rotated at 90-degrees with respect to the other pins, as best shown in the top view of the stack in FIG. 11. This is important to note now, because in subsequent steps this rotational misalignment within the holes will be fixed, thus illustrating another important advantage to the disclosed approach.

Figure 12:
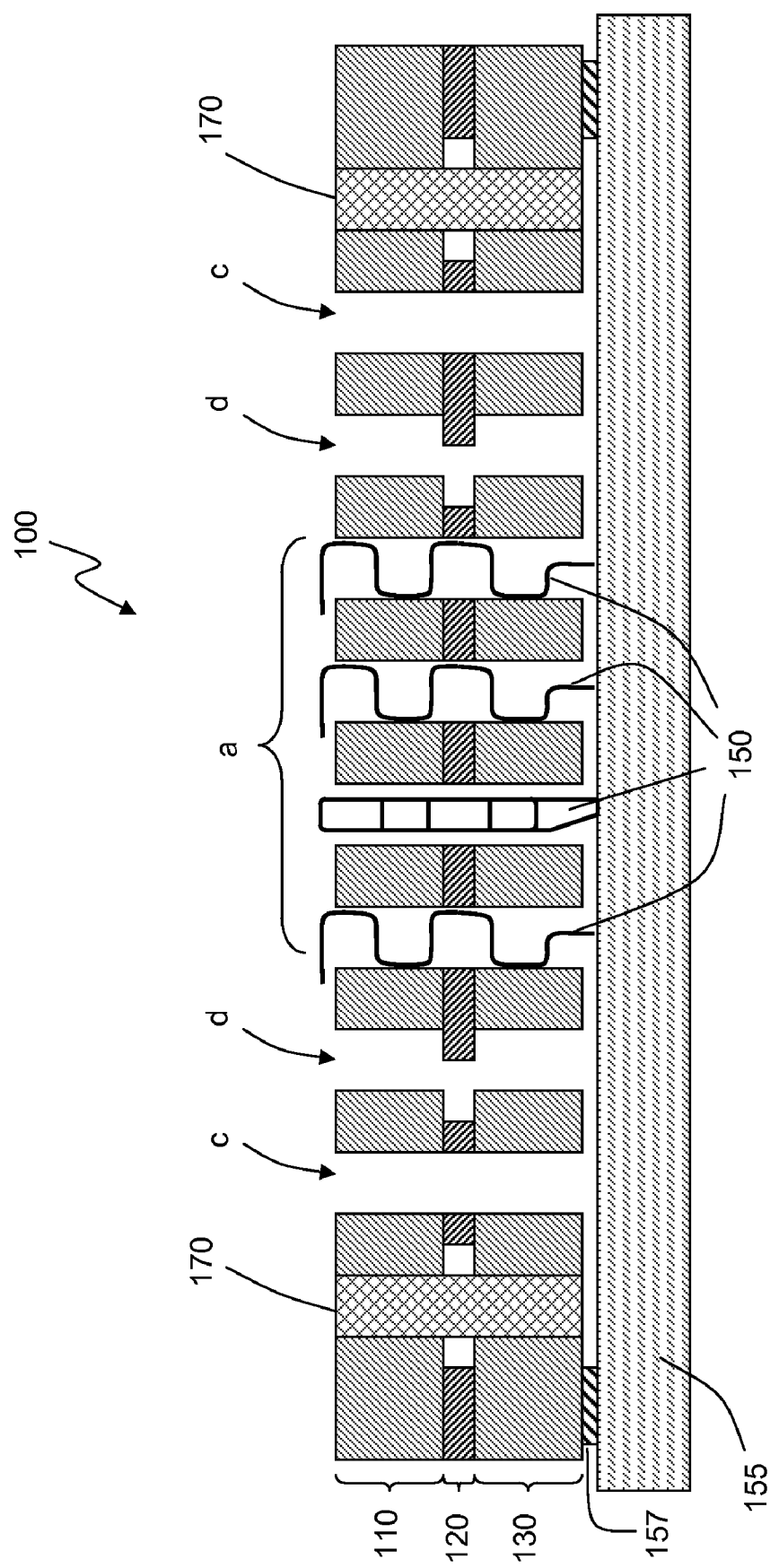

Once the probe pins 150 are in place, the dowels 180 can be removed as shown in FIG. 12, which re-exposes the "c" holes. This once again allows the middle piece 120 to move relative to the upper/lower pieces 110, 130.

As will be seen later, one aspect of the disclosed invention is ability to move the middle piece 120 to lock the probe pins into place. However, prior to this step in the assembly process, it may be desirable to rotationally align the pins in the probe pins holes ("a"). This is especially desirable if the pins are not rotationally symmetrical about their long axis, or if for some reason the probe pins have special ends that are advantageously oriented in a predictable format. Moreover, rotational alignment ensures that the probe pins can be subsequently locked without damage. Rotational alignment can also be critical for achieving consistent probe tip pointing accuracy necessary to interfacing with small pads or contacts, such as traditional wafer bond pads.

Figures 13A, 13B:
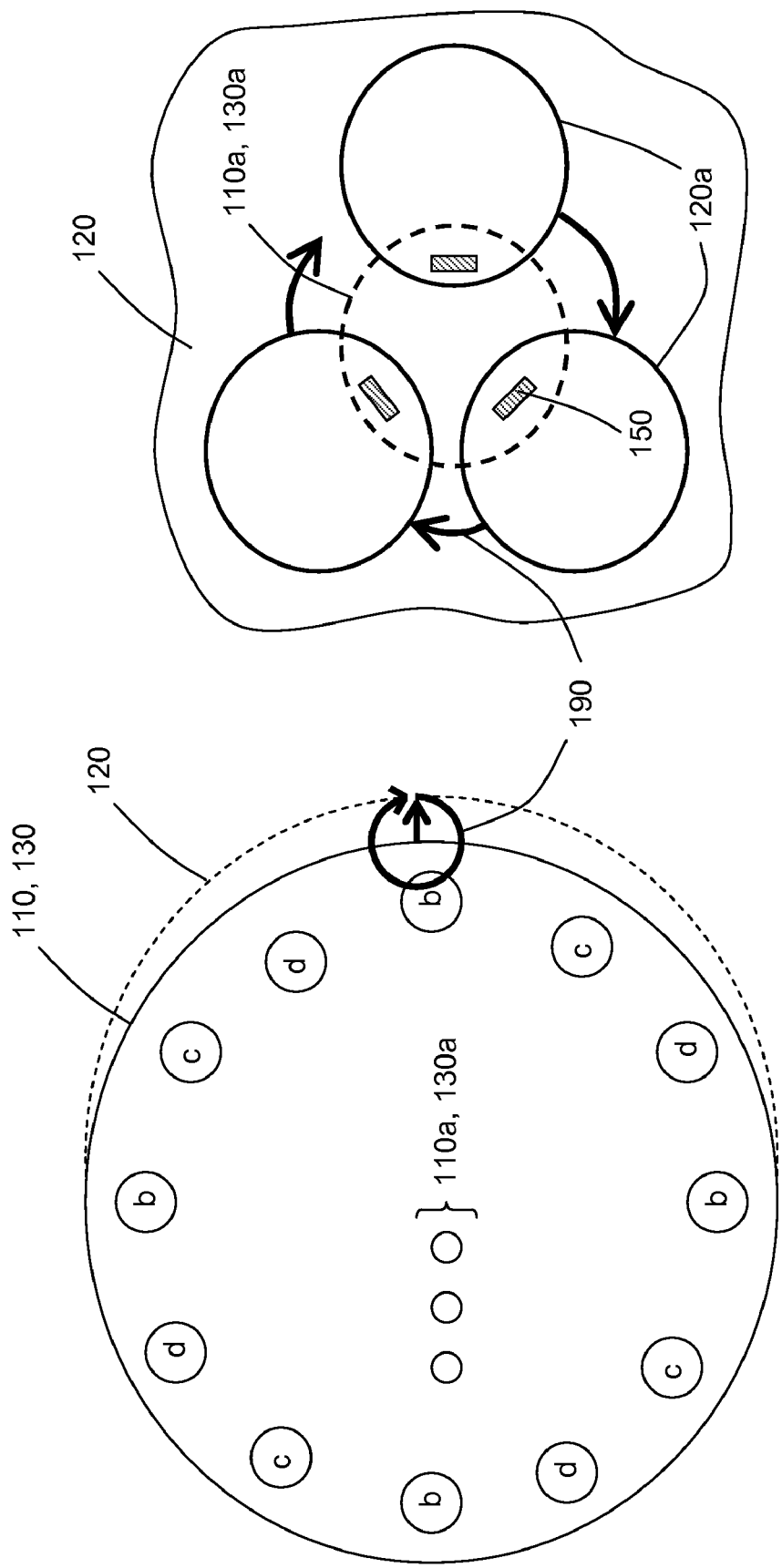

Such alignment of the probe pins can be affected by moving the middle piece 120. In a preferred embodiment, and referring to FIGS. 13A and 13B, the middle piece 120 is moved along a path 190. Several routes for path 190 are possible to perform the alignment function, but in a preferred embodiment, the path 190 first contemplates moving the middle piece 120 to a position that ideally would lock the probe pins 150 into place, which in the illustrated example would be to the right relative to the upper/lower pieces 110, 130. Of course, because not all of the probe pins are aligned at this point, free movement to the right (i.e., as far as dowels 170 would allow) might not be possible initially. Thereafter, the path of the middle piece 120 is moved in a circular fashion with respect to the upper/lower pieces 110, 130. As best shown in FIG. 13B, which shows a single hole 120a in the middle piece 120, this path 190 tends to catch the probe pins 150 at some point along their cross section, and eventually coaxes the probe pins into the proper rotational alignment.

It is preferred to rotate the path 190 through at least one full circle and back to the eventual locking position, although more than one full circle could be transgressed to ensure that all of the probe pins have been coaxed and are rotating within their probe pin holes ("a"). Movement of the middle piece 120 can be performed by hand, although movement of the middle piece 120 can also be automated as discussed earlier. Regardless of the method used to move the middle piece 120, care should be taken not to force the middle piece 120 to follow a strict set path 190, as this could damage probe pins that are not yet properly rotationally aligned. Experience teaches that an operator moving the piece 120 by hand can tell when the middle piece 120 is binding and should not be forced further. When using automated alignment processes, feedback should be gauged and limits set to ensure that the middle piece 120 is not over-forced, and/or the path should be appropriately modified to ensure that alignment will be achieved. One possible alternative path 190 that might be suitable for such an automated system is a spiral, in which the displacement of the middle piece 120 from the upper/lower pieces 110, 130 is gradually radially increased as the middle piece is rotated around.

Figure 14:
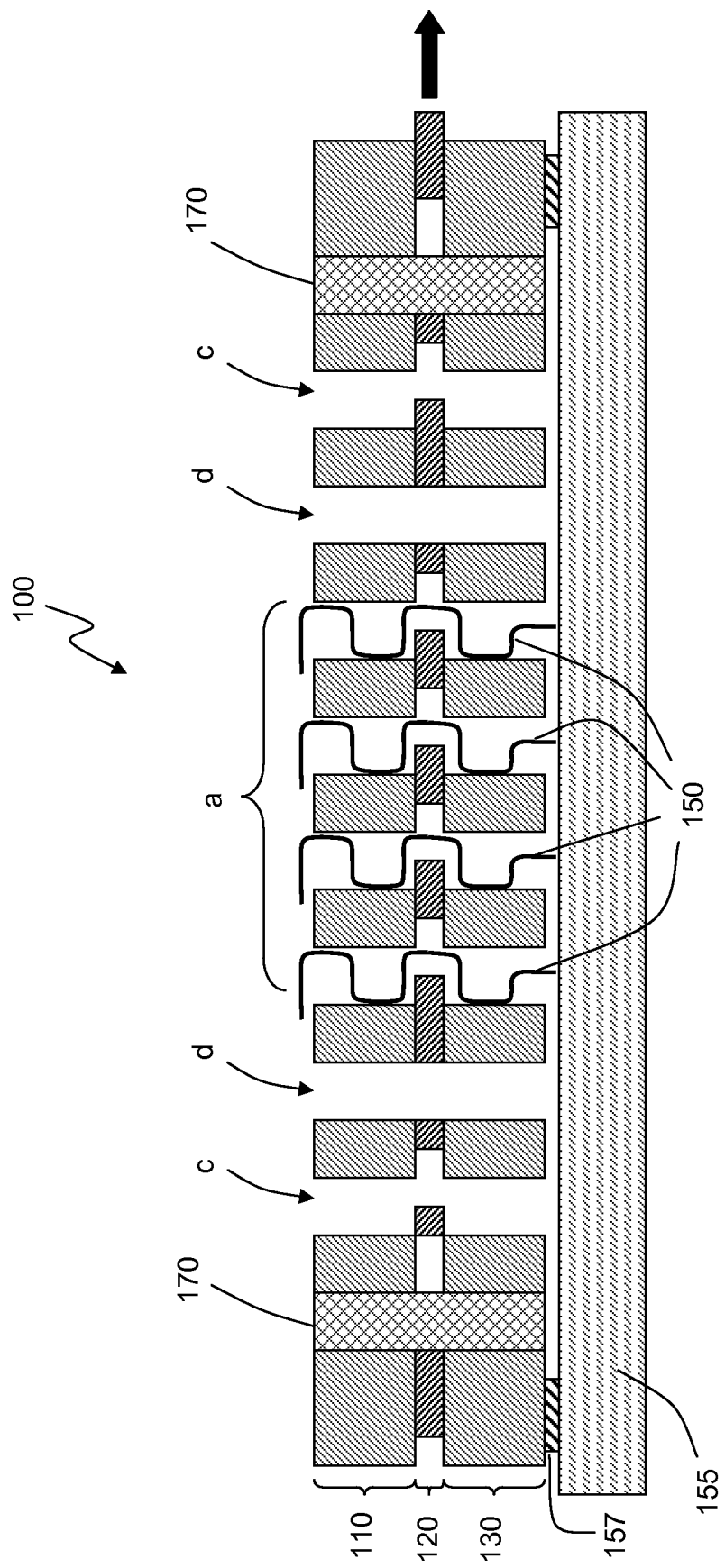
Figure 15:
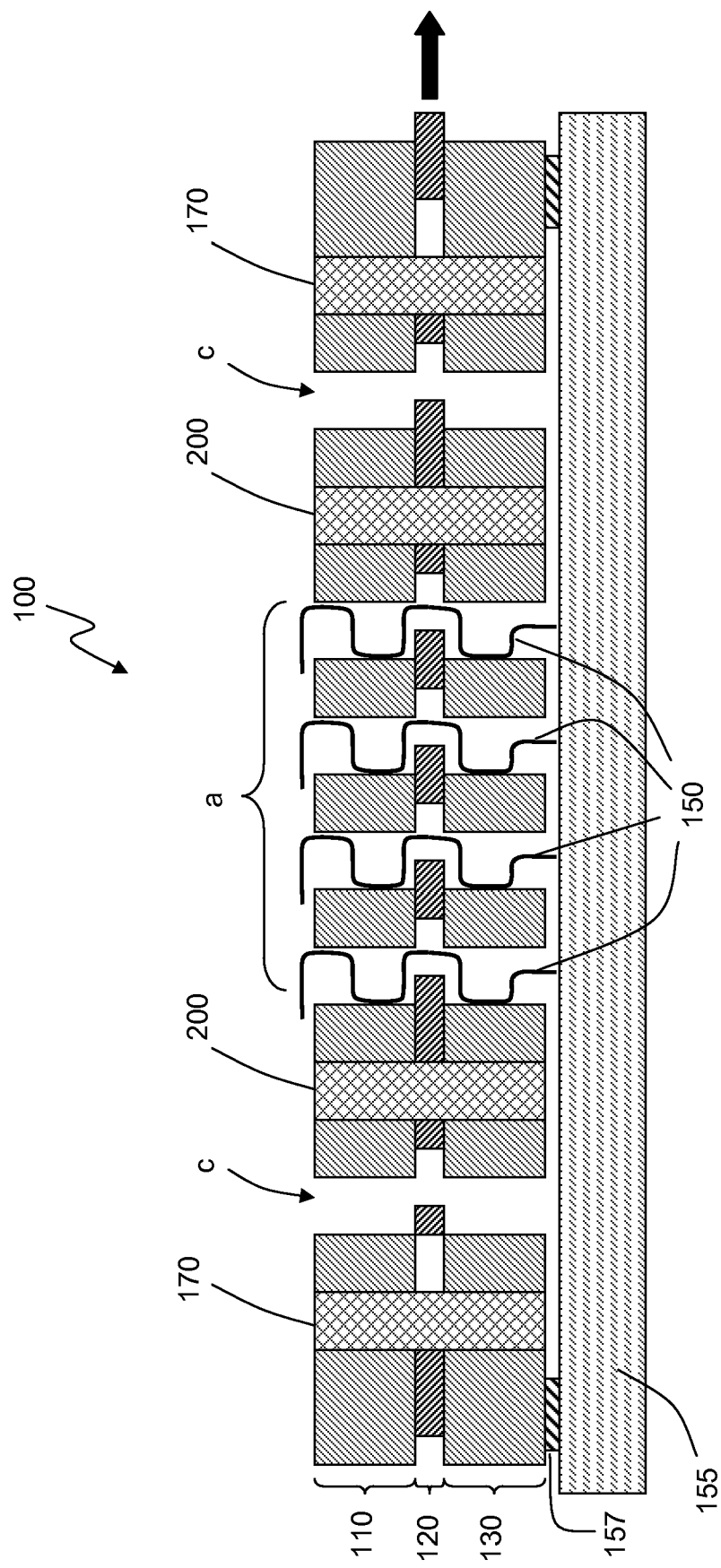

In any event, the end of the probe pin alignment procedure discussed above preferably results in bringing the middle piece 120 to a position which locks the aligned pins. As noted earlier, in the illustrated example, this occurs by moving the middle piece 120 to the right, as shown in FIG. 14. With the pins aligned, it can be seen that the middle piece 120 comes to rest within a bend in the probe pin 150. Because the middle piece 120 is bounded by this bend, the probe pin 150 will be restrained in its vertical movement, and thus becomes captured in the stack of the Z-block 100. With the pins aligned and locked into place, the assembly can be finally locked. Such locking is illustrated in FIG. 15, in which a third set of dowels 200 are press-fit into the "d" holes in the assembly. In this regard, note that the "d" holes in the middle piece 120 have been offset relative to the probe pins holes ("a") such that bringing the piece 120 into the locked position renders the "d" holes wide open (see FIG. 14) and ready to receive dowels 200. This third set of dowels 200 are similar in construction to the first set of dowels (170), and are press fit into the slightly smaller diameter "d" holes, which like the "b" holes are approximately 0.97 mm in diameter.

At this point, the Z-block 100 assembly is finished, and advantages of the disclosed method can be appreciated. First, it is easy to mount the probe pins into the Z-block, as the holes into which the probe pins are put are straight cylindrical holes (see FIG. 12). There is no need to sandwich the probe pins between two pieces of the Z-block, which as noted earlier has the propensity to damage them. The probe pins can all be aligned to a common orientation. Moreover, pins of varying geometries can be used when compared to the prior art methods disclosed earlier; for example, the pins of FIG. 3 can be captured and used with the disclosed Z-block approach even though they have larger effective diameter probe ends (FIG. 3, 32a). Additionally, the Z-block is relatively easy to service. If necessary, the pieces can be gently pried apart—for example, using a razor blade—to loosen the dowels 170, 200 present in the final assembly. After the dowels are loose, and specifically dowel 200, the middle piece 120 can be moved to unlock the probe pins 150 for easy retrieval.

It should be noted that to lock the probe pins 150 in place, it is not necessary for the middle piece 120 to contact the pin in the horizontal direction, as is shown in FIG. 15. Instead, it is sufficient that the pin movement be impeded in the vertical direction so that the pins won't slip out of the probe pin holes ("a"). Such a means of capturing the probe pins is satisfactory even if the pins are allowed some vertical play within the probe pin holes ("a"). However, in a given design, it may be desired that the pins be more firmly held in the horizontal and/or vertical directions, and if so the middle piece can be made to contact the horizontal or vertical surfaces of the probe pins 150 by choosing appropriate hole spacing and piece thicknesses given the probe pin design at issue.

The disclosed alignment method (see FIG. 13) may cause the probe pins to come to rest at different heights after they are locked. Consider for example helical probe pins. If one probe pin is rotated three-quarters of a turn during alignment, and another is only rotated half a turn, when locked they may come to rest at different heights given their helical nature. Should this cause concerns, the protruding probe tips in the Z-block 100 can be planarized after their manufacture and capture, for example, by using Chemical-Mechanical Planarization (CMP) techniques.

Figure 16A:
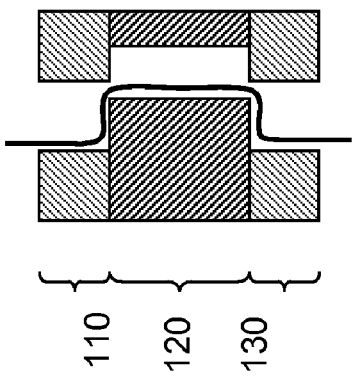
FIGS. 16A-16D show alternative designs for the probe pins and the pieces usable in the context of the disclosed Z-block.
Figure 16B:
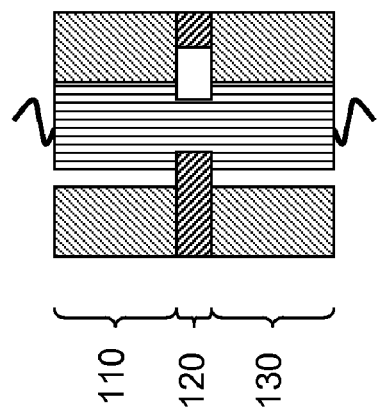
Figure 16C:
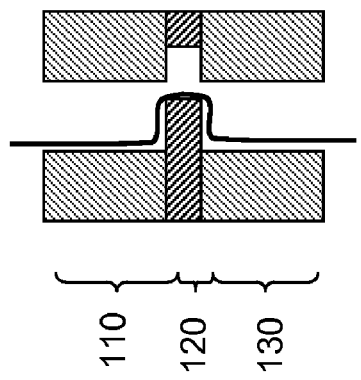
Figure 16D:
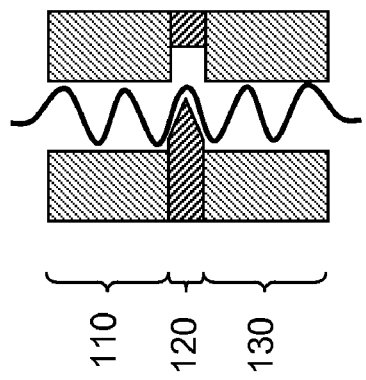

Many useful modifications can be made to the disclosed Z-block design. For example, and as shown in FIGS. 16A-16D, several different types of probe pins designs can be used. The illustration of these different pin types shows that the design of the pin can dictate a logical design for the Z-block, and in particular the design of the thicknesses used for the various pieces so that the middle pieces will most logically line up with and capture the probe pin at issue. For example, in FIG. 16B, the middle piece 120 is thicker to accommodate a thicker recess in the probe pin used in that Z-block. In FIG. 16C, the probe pin holes ("a") in the middle piece have beveled edges designed to mate with the spring (or helix) used for the probe pin. FIG. 16D shows a simplified design for a "pogo pin," which has a spring inside of a cartridge. As seen, the cartridge has a niche cut out of it to mate with the middle piece 120 during locking.

Moreover, different locking schemes can be used that don't require linear shifting of the middle piece 120 to lock the pins. For example, as shown in FIG. 17, the "d" locking holes in the middle piece 120—i.e., those used to finally lock the probe pins into position—can be offset set at an angle relative to the corresponding locking holes (110d, 130d) in the upper/lower pieces 110, 130. Accordingly, to lock the probe pins, the middle piece 120 would simply be rotated with respect to the upper/lower pieces 110, 130.

Figure 18B:
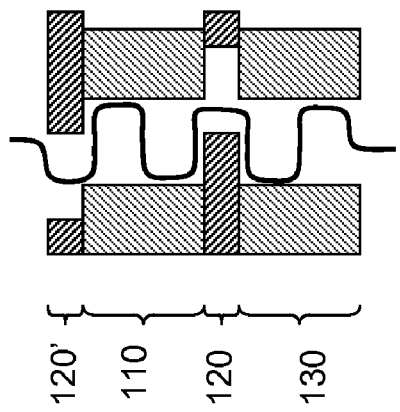
FIGS. 18A-18C show alternative Z-block designs using two, four, and five pieces.
Figure 18C:
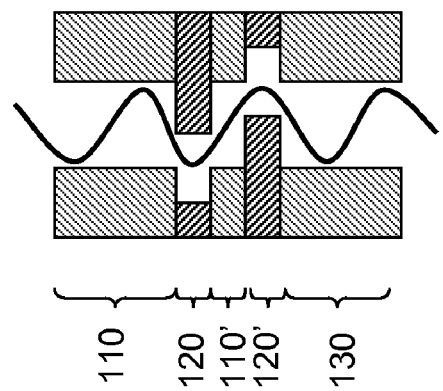
Figure 18A:
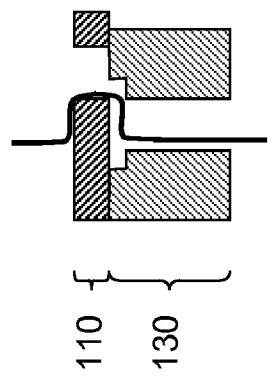

While the use of three pieces is particularly useful, other number of pieces could also be used, as illustrated in FIGS. 18A-18C which illustrates the use of Z-blocks with two pieces (FIG. 18A), four pieces (FIG. 18B), or five pieces (FIG. 18C) in which some or all of the pieces stand in slidable relation to one another. FIG. 18A is particularly interesting as it contains countersunk probe pin holes in the lower piece 130 to allow a portion of the probe pin to pass through to the upper piece 110 and ultimately out of the Z-block. By moving the upper piece 110 relative to the lower piece 130 (much as the middle piece 120 was moved in earlier embodiments), the probe pins can be aligned and locked.

While disclosed in the context of testing wafers, it should be understood that the disclosed Z-block can be used to test other sorts of planar electrical structures, such as PCBs. Moreover, while disclosed as being beneficial to the testing of entire wafers, the disclosed Z-block can be used to test individual chips on a wafer as well, and as such can be used in a more traditional wafer probe fashion.

Although it is preferred that the various pieces touch one another to form a stack of pieces, this is not strictly necessary, as the pieces can have spaces between them, which may ease their slidability. Referring to "stacked" pieces should thus be so understood.

Thus, it should be understood that the inventive concepts disclosed herein are capable of many modifications. To the extent such modifications fall within the scope of the appended claims and their equivalents, they are intended to be covered by this patent.

What is claimed is:

1. A contact system for interfacing an electrical circuit to an electrical tester, comprising:
    at least two stacked pieces, wherein each of the pieces comprises:
        a plurality of probe pin holes that form vertical sets of corresponding probe pin holes in the stacked pieces, each set of probe pin holes comprising a probe pin for making electrical contact to the electrical circuit and the electrical tester;
        a plurality of first locking holes that form vertical sets of corresponding first locking holes in the stacked pieces, wherein alignment of the corresponding first locking holes in each set causes alignment of the corresponding probe pin holes to allow for insertion of a probe pin through each set of corresponding probe pins holes; and
        a plurality of second locking holes that form vertical sets of corresponding second locking holes in the stacked pieces, wherein alignment of the corresponding second locking holes in each set causes misalignment of the corresponding probe pins holes to capture the inserted probe pins in a captured position.

2. The contact system of claim 1, wherein the captured probe pins are rotationally aligned in each set of corresponding probe pins holes.

3. The contact system of claim 1, wherein the at least two stacked pieces are slidable with respect to each other to align or misalign the corresponding probe pin holes in each set.

4. The contact system of claim 1, wherein the pieces are insulating.

5. The contact system of claim 1, wherein the probe pins are not rotationally symmetric about their long axes.

6. The contact system of claim 1, wherein the first locking holes are the same size in each of the pieces, and wherein the second locking holes are the same size in each of the pieces.

7. The contact system of claim 1, wherein the sets of first locking holes comprise first locking pins when the sets of first locking holes are aligned, and wherein the first locking pins are different from the probe pins.

8. The contact system of claim 7, wherein the sets of second locking holes comprise second locking pins when the sets of second locking holes are aligned, and wherein the second locking pins are different from the probe pins.

9. The contact system of claim 1, wherein each of the pieces further comprises:
    a plurality of third locking holes that form vertical sets of corresponding third locking holes in the stacked pieces.

10. The contact system of claim 9, wherein the third locking holes are different sizes in the two pieces.

11. A contact system for interfacing an electrical circuit to an electrical tester, comprising:
an upper piece, a middle piece, and a lower piece formed in a stack, wherein each of the pieces comprises:
a plurality of probe pin holes that form vertical sets of corresponding probe pin holes in the stacked pieces, each set of probe pin holes comprising a probe pin for making electrical contact to the electrical circuit and the electrical tester;
a plurality of first locking holes that form vertical sets of corresponding first locking holes in the stacked pieces, wherein alignment of the first locking holes in the middle piece with corresponding first locking holes in the upper and lower pieces causes alignment of the corresponding probe pin holes to allow for insertion of a probe pin through each set of corresponding probe pins holes; and
a plurality of second locking holes that form vertical sets of corresponding second locking holes in the stacked pieces, wherein misalignment of the second locking holes in the middle piece with corresponding second locking holes in the upper and lower pieces causes misalignment of the corresponding probe pins holes to capture the inserted probe pins in a captured position.

12. The contact system of claim 11, wherein the captured probe pins are rotationally aligned in each set of corresponding probe pins holes.

13. The contact system of claim 11, wherein the middle piece is slidable with respect to the upper and lower pieces to align or misalign the corresponding probe pin holes in each set.

14. The contact system of claim 11, wherein the pieces are insulating.

15. The contact system of claim 11, wherein the probe pins are not rotationally symmetric about their long axes.

16. The contact system of claim 11, wherein the first locking holes are the same size in each of the pieces, and wherein the second locking holes are the same size in each of the pieces.

17. The contact system of claim 11, wherein the sets of first locking holes comprise first locking pins when the sets of first locking holes are aligned, and wherein the first locking pins are different from the probe pins.

18. The contact system of claim 17, wherein the sets of second locking holes comprise second locking pins when the sets of second locking holes are aligned, and wherein the second locking pins are different from the probe pins.

19. The contact system of claim 11, wherein each of the pieces further comprises:
a plurality of third locking holes that form vertical sets of corresponding third locking holes in the stacked pieces.

20. The contact system of claim 19, wherein the third locking holes are the same size in the upper and lower pieces, but a different size in the middle piece.

21. A method for making a contact system for interfacing an electrical circuit to an electrical tester, wherein the contact system comprises at least two stacked pieces, wherein each of the pieces comprises probe pin holes that form vertical sets of corresponding probe pin holes in the stacked pieces, the method comprising:
aligning corresponding probe pin holes in each probe pin hole set by aligning a plurality of first vertical sets of corresponding first locking holes in the pieces;
inserting probe pins within each aligned set of corresponding probe pin holes; and
moving at least one of the pieces to align a plurality of second vertical sets of corresponding second locking holes in the pieces, thereby misaligning the corresponding probe pin holes in each probe pin hole set to capture the inserted probe pins.

22. The contact system of claim 21, wherein capturing the probe pins rotationally aligns the probe pins.

23. The contact system of claim 21, wherein the pieces are insulating.

24. The contact system of claim 21, wherein the probe pins are not rotationally symmetric about their long axes.

25. The contact system of claim 21, wherein the first locking holes are the same size in each of the pieces, and wherein the second locking holes are the same size in each of the pieces.

26. The contact system of claim 21, wherein aligning the corresponding probe pin holes in each probe pin hole set comprises placing first locking pins in the aligned plurality of first vertical sets of corresponding first locking holes, wherein the first locking pins are different from the probe pins.

27. The contact system of claim 26, wherein misaligning the corresponding probe pin holes in each probe pin hole set comprises placing second locking pins in the aligned plurality of second vertical sets of corresponding second locking holes, wherein the second locking pins are different from the probe pins.

28. A method for making a contact system for interfacing an electrical circuit to an electrical tester, wherein the contact system comprises an upper piece, a middle piece, and a lower piece formed in a stack, wherein each of the pieces comprises probe pin holes that form vertical sets of corresponding probe pin holes in the stacked pieces, the method comprising:
aligning corresponding probe pin holes in each probe pin hole set by aligning a plurality of first vertical sets of corresponding first locking holes in the pieces;
inserting probe pins within each aligned set of corresponding probe pins holes; and
moving the middle piece with respect to the upper and lower pieces to align a plurality of second vertical sets of corresponding second locking holes in the pieces, thereby misaligning the corresponding probe pin holes in each probe pin hole set to capture the inserted probe pins.

29. The contact system of claim 28, wherein capturing the probe pins rotationally aligns the probe pins.

30. The contact system of claim 28, wherein the pieces are insulating.

31. The contact system of claim 28, wherein the probe pins are not rotationally symmetric about their long axes.

32. The contact system of claim 28, wherein the first locking holes are the same size in each of the pieces, and wherein the second locking holes are the same size in each of the pieces.

33. The contact system of claim 28, wherein aligning the corresponding probe pin holes in each probe pin hole set comprises placing first locking pins in the aligned plurality of first vertical sets of corresponding first locking holes, wherein the first locking pins are different from the probe pins.

34. The contact system of claim 33, wherein misaligning the corresponding probe pin holes in each probe pin hole set comprises placing second locking pins in the aligned plurality of second vertical sets of corresponding second locking holes wherein the second locking pins are different from the probe pins.

* * * * *